United States Patent [19]
Marino

[11] 3,970,896
[45] July 20, 1976

[54] VERTICAL DEFLECTION CIRCUIT
[75] Inventor: Francis C. Marino, Dix Hills, N.Y.
[73] Assignee: Redactron Corporation, Hauppauge, N.Y.
[22] Filed: Nov. 21, 1974
[21] Appl. No.: 525,766

[52] U.S. Cl. .............................. 315/387; 315/395; 315/398; 315/399; 315/403
[51] Int. Cl.² .................... H01J 29/72; H01J 29/76
[58] Field of Search ............ 315/398, 399, 403, 387, 315/395

[56] References Cited
UNITED STATES PATENTS

| | | | |
|---|---|---|---|
| 3,139,538 | 6/1964 | Geller | 315/403 |
| 3,541,385 | 11/1970 | Rothermel | 315/398 |
| 3,659,141 | 4/1972 | Kubala | 315/403 |

Primary Examiner—Maynard R. Wilbur
Assistant Examiner—Richard E. Berger
Attorney, Agent, or Firm—Hane, Baxley & Spiecens

[57] ABSTRACT

A vertical deflection circuit which vertically deflects the electron beam of a cathode ray tube in response to vertical synchronizing pulses comprises a vertical deflection coil having one end connected to a reference voltage source and the other end connected to a first and second current generating means. The first current generating means generates a current having a repetitive sawtooth waveform which is in synchronism with vertical synchronizing pulses; and the second current generating means generates a constant current whose amplitude is selectively adjustable to control the vertical starting position of the electron beam of the cathode ray tube.

11 Claims, 1 Drawing Figure

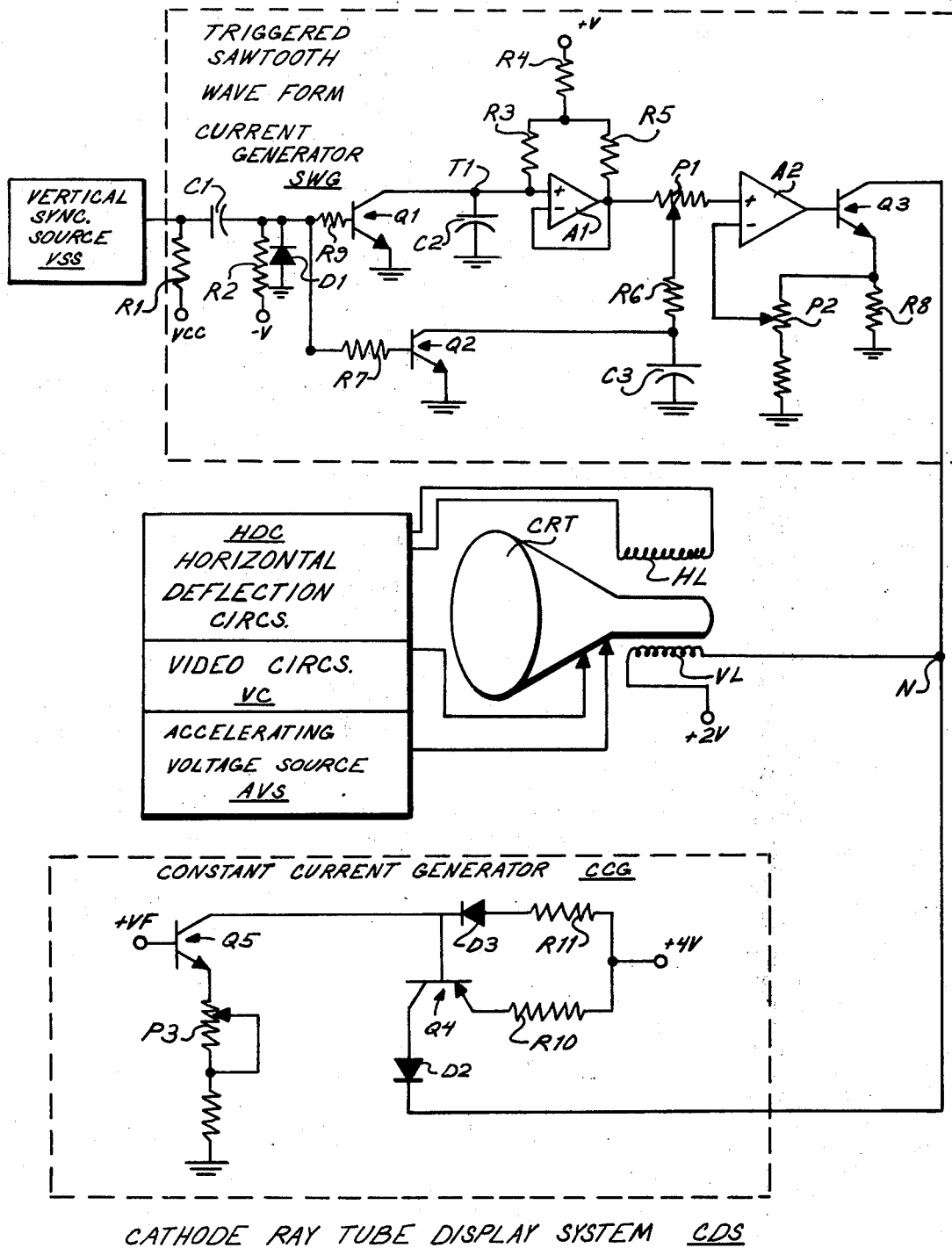

VERTICAL DEFLECTION CIRCUIT

This invention pertains to vertical deflection circuits and more particularly to the vertical deflection circuits utilized in the electromagnetic deflection of the electron beam of a cathode ray tube.

Cathode Ray Tube (CRT) monitors utilizing electromagnetic deflection generally employ a free-running sawtooth generator that is transformer-coupled to the vertical deflection coils. While such a configuration is inexpensive, it suffers from many problems and disadvantages each arising because of the specific elements employed.

Because of the use of a free-running sawtooth oscillator, synchronization to externally-applied pulses can only be accomplished over a limited range from the nominal sweep frequency. A typical tolerance of ±20% is considered excellent. However, to maintain this range requires extra circuitry for varying the nominal operating frequency of the sawtooth oscillator (usually referred to as the "vertical hold" adjustment) in order to accommodate a tolerance of this magnitude. Common noise interference can cause a loss of synchronization requiring readjustment of the vertical hold control unless more costly circuits are employed to widen the "locking range" and increase the noise immunity of the sawtooth oscillator.

The transformer required for the circuit must have a relatively large inductance. Such transformers are typically bulky in size and represent a significant percentage of the cost. The large size of this transformer follows from the fact that the frequencies involved with vertical deflection are relatively low; typically, 50 or 60 HZ.

The use of a free-running oscillator and transformer makes it impractical, from both a cost and complexity standpoint, to provide a d.c. current through the vertical deflection coils that is both adjustable in magnitude and alterable in polarity in order to allow for the electronic control of the vertical centering of the produced raster. Consequently, vertical centering is typically accomplished by means of a pair of "centering rings" externally mounted to the deflection yoke. These rings are slightly magnetized in a direction so that orientation of their relative position affects the horizontal, as well as the vertical, position of the raster. The dependence on centering rings to properly center the raster usually results in distortion from the desired orthogonality of the raster. This distortion is referred to as "pincushion" or "cigarring" of the raster. The severity of this type of distortion can be significantly reduced if the centering rings are used for only horizontal positioning of the raster provided the vertical position can be accomplished by means of electronically adjusting the average d.c. current through the vertical deflection coils.

It is accordingly an object of the invention to provide a vertical deflection circuit for a cathode ray tube which does not suffer from the above-discussed problems.

Other objects, the features and advantages of the invention will be apparent from the following detailed description when read with the accompanying drawing whose sole figure shows a presently preferred embodiment of the invention.

In the sole FIGURE a cathode ray tube CRT receives horizontal deflection currents through horizontal deflection coil HL from horizontal deflection circuits HDC, video or electron beam intensity controlling signals from video circuits VC, accelerating or operating potentials from accelerating voltage source AVS, and vertical deflection currents through vertical deflection coil VL from the vertical deflection circuit current sources comprising triggered sawtooth waveform generator SWG and constant current generator CCG.

Since the horizontal deflection circuits HDC, video circuits VC and accelerating voltage source AVS can be conventional, operate in a conventional manner, and form no part of the invention, they will not be discussed.

The vertical deflection circuits operate to provide the vertical spacing of the horizontal lines of a conventional display or television raster in response to the vertical synchronizing pulses from vertical synchronizing source VSS. It will be assumed that source VSS emits one positive going pulse per complete raster.

The trigger sawtooth waveform current generator SWG emits a quantum of current having a ramp waveform for each received vertical synchronizing pulse. The quantum of current is fed via node N connected to one end of coil VL whose other end is connected to voltage source +2V. These sequential ramp waveform currents which follow the vertical synchronizing pulses form the vertical sawtooth waveform required for the raster. In order to center the raster, constant current generator CCG feeds a constant current whose amplitude can be selectively adjusted via node N through vertical deflection coil VL.

The triggered sawtooth waveform current generator SWG comprises: a differentiator in the form of resistors R1 connected to voltage source VCC and R2 connected to voltage source −V and a differentiating capacitor C1 with a negative clipper in the form of diode D1 having a grounded anode; a triggered ramp voltage generator in the form of an integrating capacitor C2 having one terminal grounded and a second terminal T1, a constant current charging source in the form of charging resistor R3 and resistor R4 connected in series between terminal T1 and source +V, and an operational amplifier having an input connected to terminal T1 and an output connected via feedback resistor R5 to the junction of resistors R3 and R4, and a discharging means in the form of transistor Q1 having a grounded emitter terminal, a base terminal connected via resistor R9 to the output of the differentiator and a collector terminal connected to terminal T1; a ramp linearity control in the form of potentiometer P1 having a first end terminal connected to the output of amplifier A1, a second end terminal and a moving tap connected via resistor R6 and capacitor C3 connected in series to ground with a capacitor discharge means in the form transistor Q2 having a collector terminal connected to the junction of resistor R6 and capacitor C3, a grounded emitter terminal and a base terminal connected via resistor R7 to the output of the differentiator; a current driver in the form of transistor Q3 having a collector terminal connected to node N, an emitter terminal connected via emitter resistor R8 to ground and a base terminal; and an amplitude control in the form of operational amplifier A2 having a positive input connected to potentiometer P1, an output connected to the base terminal of transistor Q3, and a feedback input connected to the movable tap of potentiometer P2 whose resistance is connected between the emitter terminal of transistor Q3 and ground.

In operation, only the leading edge of each vertical synchronizing pulse is fed to the base terminals of transistors Q1 and Q2 because of the operation of the differentiator and the negative clipping provided by diode D1. The time constant of the differentiator is chosen so that capacitors C2 and C3 can be completely discharged by transistors Q1 and Q2 as will hereinafter become apparent. In fact, both of the transistors are nonconducting in the absence of a positive going signal at their base terminals. More particularly, the positive going pulse resulting from the differentiation of the leading edge of the vertical synchronizing pulse switches on transistor Q1, effectively short circuiting its collector terminal to ground. Consequently capacitor C2 completely and rapidly discharges. This is the retrace interval of the vertical deflection sweep. At the end of this positive going pulse transistor Q1 is cut off and capacitor C2 starts charging. Note operational amplifier A1 is configured as a voltage follower. In the absence of feedback resistor R5 capacitor C2 would exponentially charge toward voltage source +V at a rate controlled by charging resistor R3. Because of the voltage follower action the voltage at the output of the amplifier is the same as that at the input. Therefore, resistor R5 applies this voltage to one end of resistor R3 causing the voltage applied to that end to increase at the same rate as the voltage at the other end of the resistor R3. Hence the voltage across resistor R3 remains constant causing a constant current to be fed to capacitor C2. Therefore the voltage across capacitor C2 linearly increases. This linearly increasing voltage (a ramp waveform) is fed via potentiometer P1 and operational amplifier A2 to the current driver (transistor Q3) where it is converted to a linearly increasing current fed via node N to vertical deflection coil VL. Note the ramp waveform will continue to increase until capacitor C2 is again discharged at the leading edge of the next vertical synchronizing pulse. Note also that the termination and restart of each ramp voltage at the leading edge of each vertical synchronizing pulse results in a sawtooth waveform that is self-locked to the vertical synchronizing pulses and will follow such pulses over a very wide range which is limited only by the amplitude of the sawtooth waveform permitted by the choice of components. In any event a typical range is five to one as opposed to the maximum 20% normally attained by free-running sawtooth waveform generators.

Because of some inductive reaction in the vertical deflection coils the start of the actual vertical sweep tends to be non-linear in spite of the fact that the drive current from transistor Q3 would be absolutely linear. Therefore, the actual drive current at the start of the ramp is made slightly non-linear by means of the network comprising potentiometer P1, resistor R6 and capacitor C3. In order for the vertical sweeps to be consistently repetitive transistor Q2 discharges capacitor C3 at the exact same time capacitor C2 is discharged by transistor Q1.

To control the amplitude of the vertical sweep it is only necessary to move the tap of potentiometer P2. Thus the amount of negative feedback voltage is varied controlling the amplitude of the signal transmitted by operational amplifier A2.

Constant current generator CCG comprises: a controlled current source in the form of high gain transistor Q4 having a collector terminal connected via diode D2 to node N, an emitter terminal connected via resistor R10 to voltage source +4V and a base terminal connected via voltage compensating diode D3 and base resistor R11 to source +4V; and a control means in the form of transistor Q5 having a base terminal connected to a fixed voltage source VF, an emitter terminal connected via variable resistor P3 to ground and a collector terminal connected to the cathode of diode D3.

In operation, by varying the amount of resistance presented by resistor P3, one controls the current flowing from source +4V, via resistor R11, diode D3, transistor Q5 and resistor P3 to ground. By controlling this current one controls the voltage across resistor R11. Because of the high gain of transistor Q6 and the compensation performed by diode D3, the voltage across resistor R10 is essentially the same as the voltage across resistor R11. If one ignores the negligible base current of transistor Q4, then the current through transistor Q4 is a function of the voltage across resistor R11 which is controlled by resistor P3. Thus the amplitude of the constant current fed from constant current generator CCG is controlled by resistor P3. The current through the vertical deflection coil VL is the algebraic sum of ramp current from triggered sawtooth waveform generator SWG and the current from constant current generator CCG unidirectionally applied to node N. Thus, if the ramp current is adjusted to vary from zero to say, 500 ma., by potentiometer P2 defining the required heightof the raster, then variable resistor P3 must be adjusted so that a constant current of 500/2 = 250 ma flows through diode D2 from transistor Q4 for proper vertical centering of the raster.

There has been shown a vertical deflection circuit which by using a triggered sawtooth waveform current generator in conjunction with a constant current generator provides a circuit configuration with the following distinct advantage: the circuit is virtually "self-locking" to any vertical sync rate and is, therefore, totally impervious to noise; the circuit does not employ a bulky transformer typically required in presently-available CRT monitors; and the circuit provides a wide range of vertical raster positioning control (vertical centering) without the need of externally magnetized devices, such as "centering rings," which typically introduce distortion of the raster.

While only one embodiment of the invention has been shown and described in detail there will now be obvious to those skilled in the art many modifications and variations satisfying many or all of the objects of the invention but which do not depart from the spirit thereof.

What is claimed is:

1. Vertical deflection circuit for vertically deflecting the electron beam of a cathode ray tube in response to vertical synchronizing pulses comprising a vertical deflection coil, a reference voltage source connected to one end of said vertical deflection coil, a first current generating means connected to the other end of said vertical deflection coil, for generating a current having a repetitive sawtooth waveform in synchronism with the vertical synchronizing pulses, and a second current generating means, connected to the other end of said vertical deflection coil, for generating a constant current whose amplitude is selectively adjustable in order to control the vertical starting position of the electron beam of the cathode ray tube.

2. The vertical deflection circuit of claim 1 wherein said first current generating means comprises a triggered current generator means for generating a quantum of current having a single ramp waveform for each received vertical synchronizing pulse.

3. The vertical deflection circuit of claim 2 wherein said triggered current generator means comprises a capacitor, means for connecting one terminal of said capacitor to ground, a constant current charging source connected to the other terminal of said capacitor, and discharging means for discharging said capacitor each time a vertical synchronizing pulse is received.

4. The vertical deflection circuit of claim 3 wherein said discharging means comprises a transistor having emitter, collector and base terminals, said transistor being connected via said emitter and collector terminals in parallel with said capacitor, and said base terminal receiving the vertical synchronizing pulses.

5. The vertical deflection circuit of claim 3 wherein said constant current charging source comprises a source of current, a charging resistor connected between said source of current and the other terminal of said capacitor, an operational amplifier having an input connected to said other terminal of said capacitor and an output, and a feedback resistor connecting the output of said operational amplifier to the end of said charging resistor connected to said source of current.

6. The vertical deflection circuit of claim 5 wherein said discharging means comprises a transistor having emitter, collector and base terminals, said transistor being connected via said emitter and collector terminals in parallel with said capacitor, and said base terminal receiving the vertical synchronizing pulses.

7. The vertical deflection circuit of claim 2 wherein said first current generating means comprises a triggered ramp voltage generator having an input for receiving the vertical synchronizing pulses, a current driver means having an output connected to said other end of said vertical deflection coil, and connecting means for connecting the output of said triggered ramp voltage generator to the input of said current driver means.

8. The vertical deflection circuit of claim 7 wherein said connecting means comprises a potentiometer having a resistor connected between the output of said triggered ramp generator and the input of said current driver means, a further resistor and a capacitor connected in series between the tap of said potentiometer and ground and means for discharging said capacitor at the occurrence of each vertical synchronizing pulse.

9. The vertical deflection circuit of claim 7 wherein said current driver means comprises a transistor having a collector terminal connected to said other end of said vertical deflection coil, an emitter terminal and a base terminal, an emitter resistor connecting said emitter terminal to ground, and said connecting means comprises an operational amplifier having a direct input, a feedback input and an output connected to the base terminal of said transistor, further connecting means for connecting said direct input to the output of said triggered ramp voltage generator, and a potentiometer having a resistor connected between said emitter terminal and ground and a tap connected to the feedback of said operational amplifier.

10. The vertical deflection circuit of claim 1 wherein said second current generating means comprises at least one transistor having emitter, collector and base terminals, means for connecting said collector terminal to the other end of said vertical deflector coil, an operating voltage source, a first resistor connected between said emitter terminal and said operating voltage source, a second resistor connected between said base terminal and said operating voltage source, and control means for controlably varying the voltage across said second resistor.

11. The vertical deflection circuit of claim 10 wherein said control means comprises a second transistor having a collector terminal connected to the base terminal of said one transistor, a base terminal and an emitter terminal, means for establishing a fixed operating potential at the base terminal of said second transistor, a reference potential means, and a controllably variable resistor connected between said reference potential means and the emitter terminal of said second transistor.

* * * * *